(12) United States Patent
Haji et al.

(10) Patent No.: US 7,629,228 B2
(45) Date of Patent: Dec. 8, 2009

(54) MANUFACTURING METHOD FOR SEMICONDUCTOR DEVICES, AND FORMATION APPARATUS FOR SEMICONDUCTOR WAFER DICING MASKS

(75) Inventors: Hiroshi Haji, Chikushino (JP); Kiyoshi Arita, Fukutsu (JP); Teruaki Nishinaka, Tosu (JP)

(73) Assignee: Panasonic Corporation, Osaka (JP)

( * ) Notice: Subject to any disclaimer, the term of this patent is extended or adjusted under 35 U.S.C. 154(b) by 898 days.

(21) Appl. No.: 11/193,487

(22) Filed: Aug. 1, 2005

(65) Prior Publication Data

US 2006/0024924 A1     Feb. 2, 2006

(30) Foreign Application Priority Data

Aug. 2, 2004   (JP) ............................. 2004-225104

(51) Int. Cl.
  *H01L 21/00*   (2006.01)
(52) U.S. Cl. .......................... 438/460; 438/14; 438/17; 438/462; 438/463
(58) Field of Classification Search ............. 438/14–18, 438/460–465
  See application file for complete search history.

(56) References Cited

U.S. PATENT DOCUMENTS 5,633,173 A     5/1997   Bae 6,605,479 B1     8/2003   Pasadyn et al.
2004/0137700 A1*   7/2004   Sekiya ..................... 438/460

FOREIGN PATENT DOCUMENTS

| JP | 63-261843 | 10/1988 |
| JP | 02-305450 | 12/1990 |
| JP | 07-283179 | 10/1995 |
| JP | 2000-124270 | 4/2000 |
| JP | 2000-340527 | 12/2000 |
| JP | 2002-273884 | 9/2002 |
| WO | 03/071591 | 8/2003 |

* cited by examiner

*Primary Examiner*—Minh-Loan T Tran
*Assistant Examiner*—Yu-Hsi Sun
(74) *Attorney, Agent, or Firm*—Wenderoth, Lind & Ponack, L.L.P.

(57) ABSTRACT

On a mask placement-side surface of a semiconductor wafer in which a plurality of semiconductor devices are formed, a mask is placed, while dicing lines for dicing the semiconductor wafer into the respective separate semiconductor devices are defined and a surface of a flawed semiconductor device among the respective semiconductor devices is partially exposed, and then plasma etching is applied to the mask placement-side surface of the semiconductor wafer so as to dice the semiconductor wafer into the respective semiconductor devices along the defined dicing lines, and an exposed portion of the flawed semiconductor device is removed so as to form a removed portion as a flawed semiconductor device distinguishing mark.

11 Claims, 8 Drawing Sheets

MANUFACTURING METHOD FOR SEMICONDUCTOR DEVICES, AND FORMATION APPARATUS FOR SEMICONDUCTOR WAFER DICING MASKS

BACKGROUND OF THE INVENTION

The present invention relates to a dicing method for a semiconductor wafer in which a semiconductor wafer with a plurality semiconductor devices formed thereon is diced into the respective separate semiconductor devices by application of plasma etching, a manufacturing method for semiconductor devices including such a dicing method involving the plasma etching as a part of its process, and a formation apparatus for semiconductor wafer dicing masks for forming semiconductor wafer dicing masks for defining dicing lines used for dicing of the respective separate semiconductor devices through the plasma etching.

Conventionally, in manufacturing of such semiconductor devices, after a plurality of semiconductor devices are formed on a circuit formation face of a semiconductor wafer, the formed semiconductor devices undergo an inspection (mainly an inspection of electric characteristic), and based on the result of quality check, flawed (bad) semiconductor devices are marked, for example, on their surfaces, so as to be visibly distinguishable from other semiconductor devices for management of the flawed semiconductor devices.

As such conventional marking methods, a method for forming bad marks on the surface of the flawed semiconductor devices with inks and a method for forming bad marks through formation of resist films are known (see, e.g., Japanese unexamined patent publication No. 2000-124270 A).

SUMMARY OF THE INVENTION

After the inspection of the semiconductor devices, and formation of bad marks on the flawed semiconductor devices reflecting the result of the inspection, polishing process is performed on the face of the opposite side for the circuit formation face of the semiconductor wafer as a thinning processing of the semiconductor wafer to the level of, for example, a thickness of 100 μm or smaller.

However, by forming such bad marks (formed on the circuit formation face), smooth protuberant portions (protuberance layer) are formed only on portions of the circuit formation face of the semiconductor wafer where the bad marks are formed. Thus, with the protuberant portions partially formed on the circuit formation face, as a result of polishing process performed on the opposite face, smooth recess portions are formed in turn on portions corresponding to the places where the protuberant portions are formed on the pertinent face. This causes such problem as degraded quality of semiconductor devices as the formation of the bad marks aiming at quality management of the semiconductor devices contrarily hinders the uniformity of the thickness of manufactured semiconductor devices. Particularly, the thinned semiconductor wafer is often required a higher-level uniformity of the thickness, making occurrence of such a problem more prominent.

An object of the present invention is to provide, for solving the problem, a dicing method for semiconductor wafer capable of distinguishing flawed semiconductor devices from other semiconductor devices while preventing degradation of the quality of the respective semiconductor devices in a semiconductor wafer, a manufacturing method for semiconductor devices, and a formation apparatus for semiconductor wafer dicing masks for use during dicing of the semiconductor devices.

In order to accomplish the object, the present invention is constituted as shown below.

According to a first aspect of the present invention, there is provided a manufacturing method for semiconductor devices comprising:

placing a mask on a mask placement-side surface of a semiconductor wafer in which a plurality of semiconductor devices are formed, while defining dicing lines for dicing the semiconductor wafer into the respective separate semiconductor devices and partially exposing the mask placement-side surface on a flawed semiconductor device among the respective semiconductor devices; and dicing (separating or dividing) the semiconductor wafer into the respective semiconductor devices along the defined dicing lines and removing an exposed portion of the flawed semiconductor device so as to form a removed portion as a distinguishing mark for the flawed semiconductor device, by applying plasma etching to the mask placement-side surface of the semiconductor wafer, thereby the separated respective semiconductor devices distinguishably from the flawed semiconductor devices are manufactured.

According to a second aspect of the present invention, there is provided the manufacturing method for semiconductor devices as defined in the first aspect, wherein the mask is placed so as to partially expose the surface of the flawed semiconductor device on basis of position information for the flawed semiconductor device in the semiconductor wafer.

According to a third aspect of the present invention, there is provided the manufacturing method for semiconductor devices as defined in the first aspect, further comprising:

obtaining position information for the flawed semiconductor device in the semiconductor wafer before placing the mask, wherein the mask is placed on basis of the obtained position information for the flawed semiconductor device.

According to a fourth aspect of the present invention, there is provided the manufacturing method for semiconductor devices as defined in second aspect, wherein the position information for the flawed semiconductor device is formed by using a result of an inspection performed on the respective semiconductor devices in the semiconductor wafer.

According to a fifth aspect of the present invention, there is provided the manufacturing method for semiconductor devices as defined in the first aspect, wherein in placing of the mask, the mask is placed so as to cover the entire mask placement-side surface of the semiconductor wafer, and then parts of the mask are removed in conformity with the respective positions of the dicing lines on the semiconductor wafer so as to partially expose the surface of the semiconductor wafer to define the dicing lines, and a part of the mask on the flawed semiconductor device is removed so as to partially expose the surface of the flawed semiconductor device.

According to a sixth aspect of the present invention, there is provided the manufacturing method for semiconductor devices as defined in the fifth aspect, wherein the mask is removed by irradiating a laser beam to the mask of the semiconductor wafer while moving the laser beam relatively along to the surface of the semiconductor wafer.

According to a seventh aspect of the present invention, there is provided the manufacturing method for semiconductor devices as defined in the sixth aspect, wherein the laser beam is relatively moved on basis of preset mask data.

According to an eighth aspect of the present invention, there is provided the manufacturing method for semiconductor devices as defined in the sixth aspect, wherein the laser beam is relatively moved, on basis of position information for the dicing lines and position information for the flawed semiconductor device in the semiconductor wafer.

According to a ninth aspect of the present invention, there is provided the manufacturing method for semiconductor devices as defined in the first aspect, wherein the mask is placed so as to expose an almost central area of the surface of the flawed semiconductor device in an almost circular shape.

According to a tenth aspect of the present invention, there is provided the manufacturing method for semiconductor devices as defined in the first aspect, further comprising:

removing the respective masks from the mask placement-side surface of the semiconductor wafer, after dicing the semiconductor and removing the exposed portion.

According to an eleventh aspect of the present invention, there is provided the manufacturing method for semiconductor devices as defined in the fourth aspect, wherein after the inspection of the respective semiconductor devices, thinning of the semiconductor wafer is performed, and then the mask is placed on the thinned semiconductor wafer.

According to a twelfth aspect of the present invention, there is provided a manufacturing method for semiconductor devices comprising:

placing a mask on a mask placement-side surface of a semiconductor wafer in which a plurality of semiconductor devices are formed, while defining dicing lines for dicing the semiconductor wafer into the respective separate semiconductor devices and entirely exposing the mask placement-side surface on a flawed semiconductor device among the respective semiconductor devices; and dicing the semiconductor wafer into the respective semiconductor devices along the defined dicing lines and removing the flawed semiconductor device entirely, by applying plasma etching to the mask placement-side surface of the semiconductor wafer, thereby the separated respective semiconductor devices are manufactured.

According to a thirteenth aspect of the present invention, there is provided the manufacturing method for semiconductor devices as defined in the twelfth aspect, wherein the mask is placed so as to entirely expose the surface of the flawed semiconductor device on basis of position information for the flawed semiconductor device in the semiconductor wafer.

According to a fourth aspect of the present invention, there is provided the manufacturing method for semiconductor devices as defined in the twelfth aspect, further comprising:

obtaining position information for the flawed semiconductor device in the semiconductor wafer before placing of the mask, wherein the mask is placed on basis of the obtained position information for the flawed semiconductor device.

According to a fifth aspect of the present invention, there is provided the manufacturing method for semiconductor devices as defined in the thirteenth aspect, wherein the position information for the flawed semiconductor device is formed by using a result of an inspection performed on the respective semiconductor devices in the semiconductor wafer.

According to a sixteenth aspect of the present invention, there is provided the manufacturing method for semiconductor devices as defined in the twelfth aspect, wherein in placing of the mask, the mask is placed so as to cover the entire mask placement-side surface of the semiconductor wafer, and then parts of the mask are removed in conformity with the respective positions of the dicing lines on the semiconductor wafer so as to partially expose the surface of the semiconductor wafer to define the dicing lines, and the entire mask on the flawed semiconductor device is removed so as to entirely expose the surface of the flawed semiconductor device.

According to a seventeenth aspect of the present invention, there is provided the manufacturing method for semiconductor devices as defined in the sixteenth aspect, wherein the mask is removed by irradiating a laser beam to the mask of the semiconductor wafer while moving the laser beam relatively along to the surface of the semiconductor wafer.

According to an eighteenth aspect of the present invention, there is provided the manufacturing method for semiconductor devices as defined in the seventeenth aspect, wherein the laser beam is relatively moved on basis of preset mask data.

According to a nineteenth aspect of the present invention, there is provided the manufacturing method for semiconductor devices as defined in the seventeenth aspect, wherein the laser beam is relatively moved on basis of position information for the dicing lines and position information for the flawed semiconductor device in the semiconductor wafer.

According to a twentieth aspect of the present invention, there is provided the manufacturing method for semiconductor devices as defined in the twelfth aspect, further comprising:

removing the respective masks from the mask placement-side surface of the semiconductor wafer, after dicing the semiconductor wafer and removing the exposed portion.

According to a 21st aspect of the present invention, there is provided the manufacturing method for semiconductor devices as defined in the fifteenth aspect, wherein after the inspection of the respective semiconductor devices, thinning of the semiconductor wafer is performed, and then the mask is placed on the thinned semiconductor wafer.

According to a 22nd aspect of the present invention, there is provided a formation apparatus for semiconductor wafer dicing masks for defining dicing lines to dice a semiconductor wafer, in which a plurality of semiconductor devices are formed, into respective separate semiconductor devices through plasma etching processing by partial removal of a mask placed so as to cover an entire mask placement-side surface of the semiconductor wafer, comprising:

a wafer holding device for holding the semiconductor wafer;

a laser irradiation device for irradiating a laser beam to the mask on the semiconductor wafer held by the wafer holding device so as to remove an irradiated portion of the mask;

a moving device for relatively moving the wafer holding device and the laser irradiation device in directions along the surface of the semiconductor wafer; and a control device having position information for the dicing lines and position information for a flawed semiconductor device among the respective semiconductor is devices, which is operable to remove a portion of the mask corresponding to the dicing lines and remove the mask so as to partially or entirely expose the surface of the flawed semiconductor device, by controlling operations of the laser irradiation device and the moving device on basis of the position information for the dicing lines, and thereby the semiconductor wafer dicing mask is formed.

According to the first aspect of the present invention, when a mask for defining dicing lines of the respective semiconductor devices is placed on the mask placement-side surface of the semiconductor wafer, the placement is performed so as to partially expose the surface of a flawed semiconductor device, and then plasma etching is applied, so that the semiconductor wafer is diced into the respective separate semiconductor devices along the dicing lines and at the same time (simultaneously) an exposed portion of the flawed semiconductor device is removed so as to form the removed portion into a flawed semiconductor device distinguishing mark (bad mark). Thus, by forming the flawed semiconductor device distinguishing mark through plasma etching in the final stage of the manufacturing process of the semiconductor devices, it becomes possible to prevent occurrence of such conventional problem that bad marks with use of inks and resist films which are formed as prominent portions cause dispersion of the thickness of the semiconductor wafer through the thinning processing.

Moreover, the plasma etching for dicing the semiconductor device into the respective separate semiconductor devices allows the dicing together with the formation of the bad marks, which makes it possible to provide a dicing method for semiconductor wafers capable of realizing efficient formation of the bad marks, i.e., a manufacturing method for semiconductor devices.

Therefore, it becomes possible to efficiently form the distinguishing marks allowing clear distinction of the flawed semiconductor device from other semiconductor devices without degrading the quality of the semiconductor devices, and to stabilize the quality of the diced semiconductor devices.

According to the second aspect or the third aspect of the present invention, by conducting such placement of the mask based on the position information for the flawed semiconductor device, it becomes possible to specifically realize the formation of the bad marks and the dicing with use of, for example, automated apparatuses and the like.

According to the fourth aspect of the present invention, since the position information for such a flawed semiconductor device is position information formed based on the result of the inspection performed on the respective semiconductor devices, the information obtained from the inspection process can be directly linked to the formation of the bad marks on the flawed semiconductor devices, thereby allowing reliable formation of the bad marks.

According to the fifth aspect of the present invention, the formation of the mask is achieved by placing the mask in such a way as to cover the entire mask placement-side surface of the semiconductor wafer and by applying processing to partially remove the placed mask.

According to the sixth aspect, the seventh aspect or the eighth aspect of the present invention, the processing of the mask can be specifically realized with use of laser beams. Moreover, by relatively moving the laser beam and the semiconductor wafer during such processing based on mask data and position information for the flawed semiconductor device, the mask at a desired position will be credibly removed According to the ninth aspect of the present invention, by placing the mask so as to expose an almost central area of the surface of the flawed semiconductor device in an almost circular shape, the dicing lines defined by the mask are definitely positioned between the flawed semiconductor devices and the adjacent semiconductor devices, which makes it possible to maintain the uniformity of etching of dicing position portions in the plasma etching operation and to provide high-quality semiconductor devices.

According to another aspect of the present invention, during the placement of the mask, instead of being partially exposed, the surface of the flawed semiconductor device is totally exposed, so that the flawed semiconductor device itself is removed by the plasma etching. Thus, removing the flawed semiconductor device itself makes it possible to credibly prevent the flawed semiconductor device from being confused with other semiconductor devices.

Moreover, by incorporating such semiconductor wafer dicing methods of the respective aspects in the manufacturing process of semiconductor devices, it becomes possible to provide a manufacturing method for semiconductor devices capable of covering acquisition of the position information for flawed semiconductor devices from the inspection process to dicing of the semiconductor wafer into the respective separate semiconductor devices performed together with formation of the bad marks.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
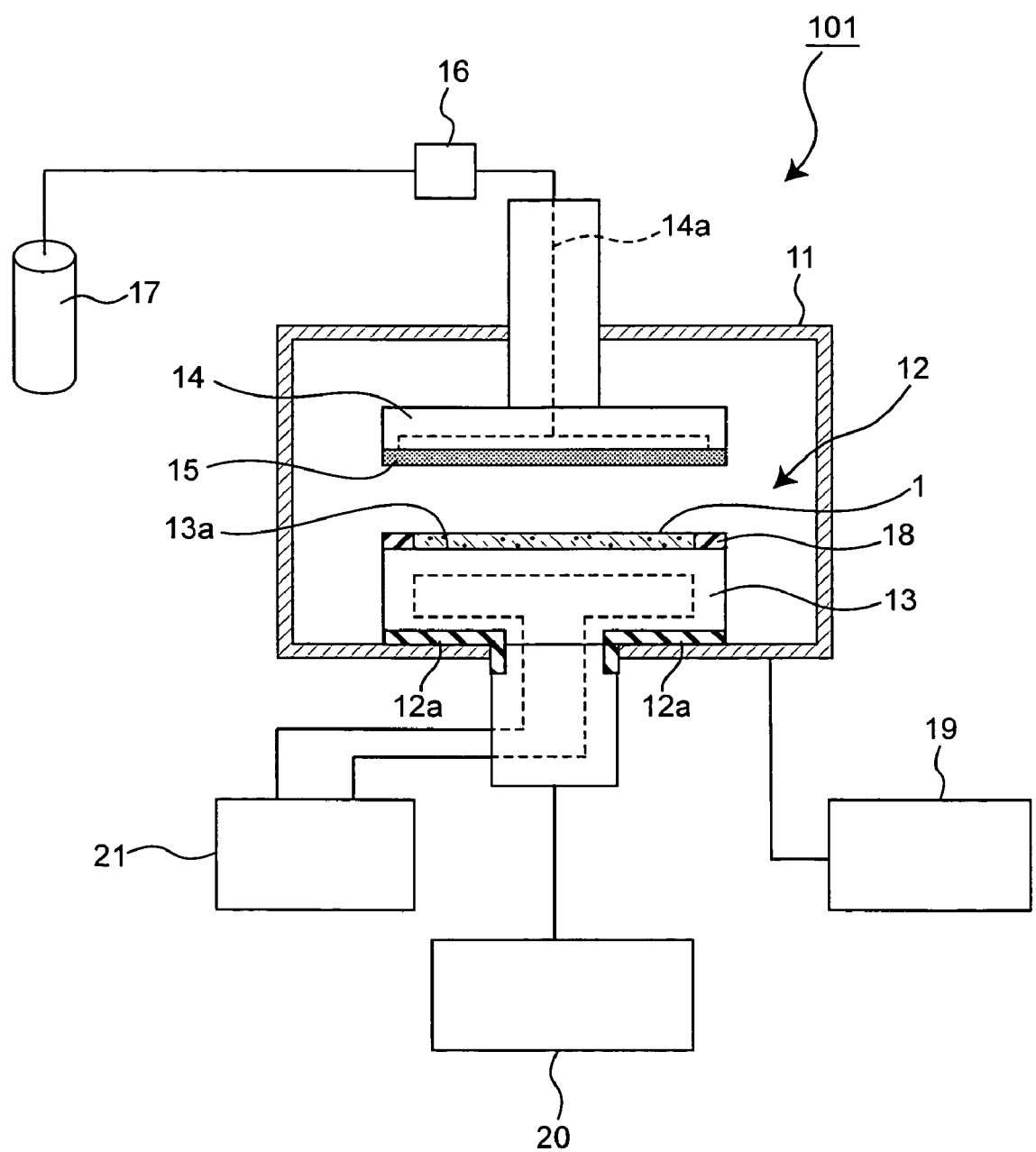
FIG. 1 is a schematic diagram for showing a plasma processing apparatus for use in the manufacturing process of semiconductor devices according to a first embodiment of the present invention.

Before the description of the present invention proceeds, it is to be noted that like parts are designated by like reference numerals throughout the accompanying drawings.

Hereinbelow, the embodiment of the present invention will be described in detail with reference to the drawings.

For describing a semiconductor wafer dicing method and a semiconductor device manufacturing method according to a first embodiment of the present invention, first, the structure of the apparatuses for use in the dicing method and the manufacturing method will be described.

FIG. 1 shows a schematic diagram schematically showing the structure of a plasma processing apparatus 101 exemplifying the semiconductor wafer dicing apparatus for implementing the semiconductor wafer dicing method in the first embodiment. The plasma processing apparatus 101 applies plasma etching to a semiconductor wafer having a plurality of semiconductor devices formed thereon to conduct dicing (plasma dicing) of the semiconductor wafer into respective separate semiconductor devices. First, the outlined structure of the plasma processing apparatus 101 will be described hereinbelow with reference to FIG. 1.

As shown in FIG. 1, the plasma processing apparatus 101 has a vacuum chamber 11 that includes a processing chamber 12 of an enclosed space for applying plasma processing to a semiconductor wafer 1. Inside the vacuum chamber 11, a lower electrode 13 and an upper electrode 14 are parallely disposed facing each other. Moreover, on the upper face of the lower electrode 13 as viewed in the drawing, a mounting face 13a on which an almost disc-shaped semiconductor wafer 1 can be mounted is formed, and the semiconductor wafer 1 is mounted on the mounting face 13a in the state that the entire periphery thereof is surrounded by an insulating ring 18. Moreover, the mounting face 13a has a function to suck and hold the mounted semiconductor wafer 1 in a releasably way through vacuum suction or electrostatic suction. The lower electrode 13 is disposed inside the processing chamber 12 through an insulator 12a, with the lower electrode 13 and the processing chamber 12 being electrically insulated through the insulator 12a.

Moreover, in the upper electrode 14, a gas supply hole 14a, which is a passage to supply plasma generation gas to the inside of a space (electric discharge space) formed between the upper electrode 14 and the lower electrode 13, is formed in such a way as to go through the inside of the upper electrode 14. Moreover, one end of the gas supply hole 14a in the upper electrode 14 formed to be linked to the outside of the vacuum chamber 11 is connected to a plasma generation gas supply unit 17 provided outside of the vacuum chamber 11, which makes it possible to supply, for example, a fluorinated plasma generation gas from the plasma generation gas supply unit 17 to the processing chamber 12 through the gas supply hole 14a. It is to be noted that at some midpoint of the gas supply passage extending between the plasma generation gas supply unit 17 and the one end of the gas supply hole 14a, a flow regulating valve 16 exemplifying a gas flow rate regulating portion for regulating a supply gas flow rate to a desired flow rate is provided. Further, a porous plate 15 is seated on the lower surface of the upper electrode 14 as viewed in the drawing, which makes it possible to supply the plasma generation gas supplied through the gas supply hole 14a to the inside of the processing chamber 12 in such a way as to be evenly sprayed to the semiconductor wafer 1 mounted on the mounting face 13a of the lower electrode 13 through the porous plate 15.

Moreover, the plasma processing apparatus 101 has an air discharging pump 19 exemplifying an evacuation apparatus for reducing the pressure in the processing chamber 12 to a desired pressure (i.e., vacuumizing the processing chamber 12) by evacuating the processing chamber 12. Moreover, an RF power supply unit 20 is electrically connected to the lower electrode 13, which makes it possible to apply high-frequency voltage to the lower electrode 13 from the RF power supply unit 20.

In the thus-structured plasma processing apparatus 101, after the semiconductor wafer 1 is mounted on the mounting face 13a of the lower electrode 13 and the vacuum chamber 11 is enclosed, the processing chamber 12 is evacuated and vacuumized by the air discharging pump 19 and a high-frequency voltage is applied to the lower electrode 13 by driving the RF power supply unit 20 while a specified amount of the plasma generation gas is supplied to the processing chamber 12 from the plasma generation gas supply unit 17, by which fluorinated plasma is generated between the electric discharge space between the upper electrode 14 and the lower electrode 13. By irradiating thus-generated plasma to the surface of the semiconductor wafer 1, etching (i.e., plasma etching) of the irradiated surface can be implemented. It is to be noted that the plasma processing apparatus 101 has a cooling unit 21 for cooling the semiconductor wafer 1 mounted on the mounting face 13a of the lower electrode 13 through the mounting face 13a by circulating a coolant inside the lower electrode 13 Thus, the presence of the cooling unit 21 makes it possible to prevent the temperature of the semiconductor wafer 1 from increasing beyond a specified temperature from the heat generated during plasma processing.

Figure 2:
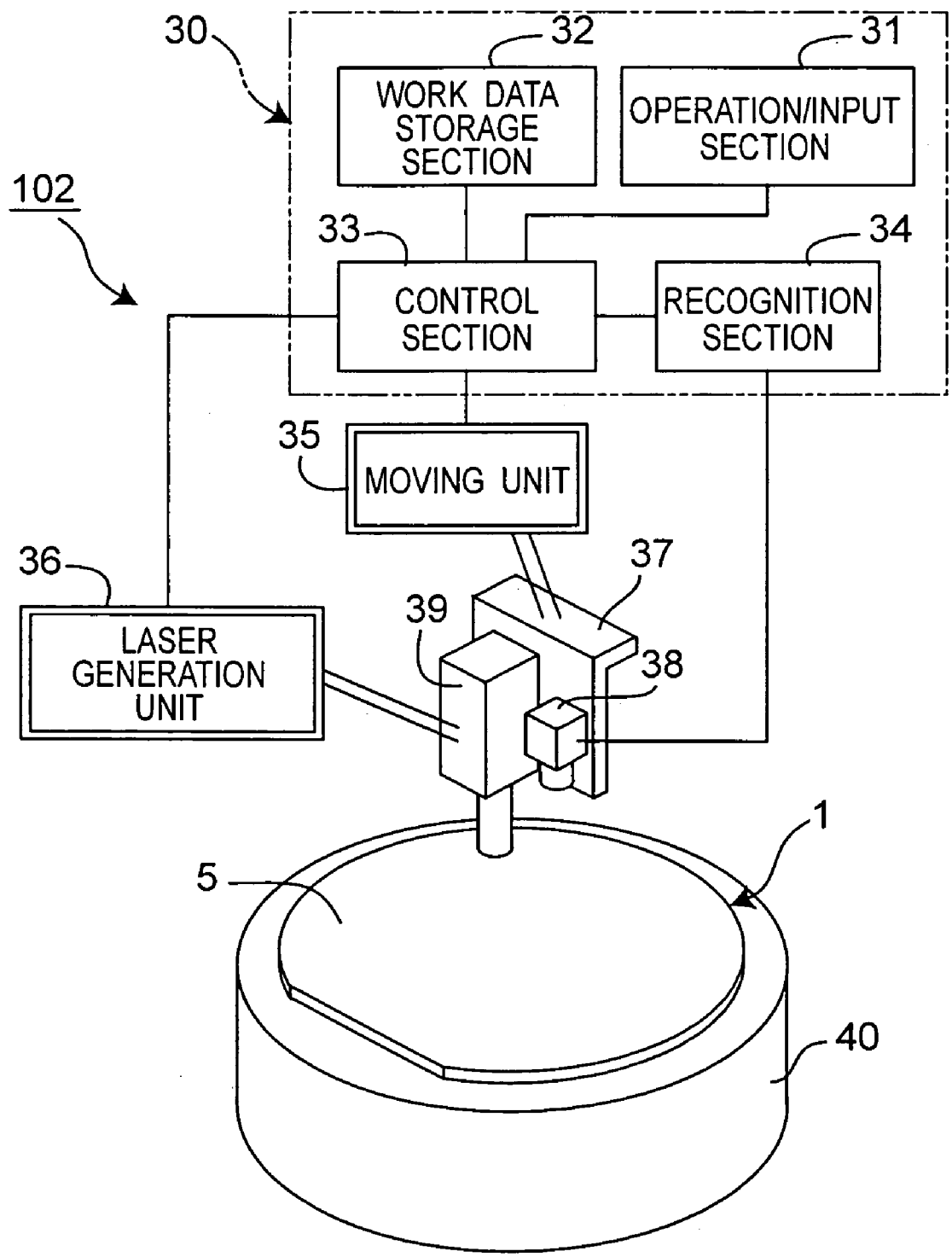
FIG. 2 is a schematic diagram for showing a laser processing apparatus for use in the manufacturing process of the semiconductor devices in the first embodiment of the present invention.

Description is now given of the structure of a laser processing apparatus 102 exemplifying the formation apparatus for semiconductor wafer dicing masks, in which during plasma dicing by such a plasma processing apparatus 101, a mask layer placed on the surface of a semiconductor wafer 1 is processed with a laser beam along the dicing positions of respective semiconductor devices to form dicing lines, with reference to the schematic block diagram in FIG. 2.

As shown in FIG. 2, the laser processing apparatus 102 has a wafer holding unit 40 (wafer holding device) for holding the semiconductor wafer 1 having a mask layer 5 formed thereon in the state of being exposed in a releasably way. A moving plate moving head 37 equipped with a laser irradiation unit 39 and a camera 38 is provided on the wafer holding unit 40 is, and further a moving apparatus (device) 35 for moving the moving plate moving head 37 relatively to the wafer holding unit 40 is provided along the surface of the semiconductor wafer 1 in the state of being held by the wafer holding unit 40. Thus, the moving apparatus 35 moving the moving plate moving head 37 allows the laser irradiation unit 39 and the camera 38 attached to the moving plate moving head 37 to be moved relatively to the wafer holding unit 40. Moreover, the laser irradiation unit 39 is capable of irradiating the laser beam generated by a laser generation unit 36 to the semiconductor wafer 1 disposed below. It is to be noted that in the first embodiment, the laser irradiation apparatus (device) comprises the laser irradiation unit 39 and the laser generation unit 36.

The camera 38 is an infrared camera for picking images of the semiconductor wafer 1 disposed below by infrared light. In this case, images of a circuit pattern or distinguishing marks on the circuit formation face of the semiconductor wafer 1 may be picked up through the mask layer 5. Then, the image pick-up result is inputted into a recognition section 34 included in a laser processing control unit 30 exemplifying a control device, where recognition processing is performed to detect the position and the circuit pattern arrangement of the semiconductor wafer 1.

Moreover, the laser processing control unit 30 comprises a control section 33 for controlling laser generation operation by the laser generation unit 36, moving operation by the moving apparatus 35 and recognition processing by the recognition section 34, an operation/input section 31 for operating and commanding the control by the control section 33, and a work data storage section 32 for storing data which is referred during control operation by the control section 33. The work data storage section 32 stores data on dicing positions (dicing lines or parting lines) of respective semiconductor devices on the semiconductor wafer 1 and data on the width of the dicing lines formed at the dicing positions (dicing width), i.e., the removal width of the mask layer removed along the dicing positions. Data write onto the work data storage section 32 is executable by the operation/input section 31.

When laser processing of the semiconductor wafer 1 is executed in the laser processing apparatus 102 having such structure, the control section 33 controls the moving apparatus 35 based on an actual position data of the semiconductor wafer 1 detected by the recognition section 34 and the data on the dicing positions stored in the work data storage section 32. With this, the moving apparatus 35 makes it possible to move the laser irradiation unit 39 along the dicing positions on the upper face of the semiconductor wafer 1. Further, by the control section 33 controlling the laser generation unit 36 based on the data on the width of the dicing lines, it becomes possible to irradiate a laser beam with an output appropriate for removing the mask layer 5 with a removal width corresponding to the width of the dicing lines from the laser irradiation unit 39. By executing such laser processing, it becomes possible to form a mask pattern with only a portion corresponding to the dicing lines for separating the semiconductor devices from each other being removed in the mask layer 5 on the surface of the semiconductor wafer 1.

Description is now given of a series of the manufacturing processes of respective semiconductor devices including the dicing of the semiconductor wafer 1 performed with use of the thus-structured laser processing apparatus 102 and the plasma processing apparatus 101. For the description, FIG. 3 shows a flowchart showing the procedures in the manufacturing process of the semiconductor devices, and further FIGS. 4A, 4B, 4C, 4D, 5A, 5B, 5C, 5D, 5E and 5F show schematic explanatory views for explaining the procedures of the manufacturing process.

Figure 3:
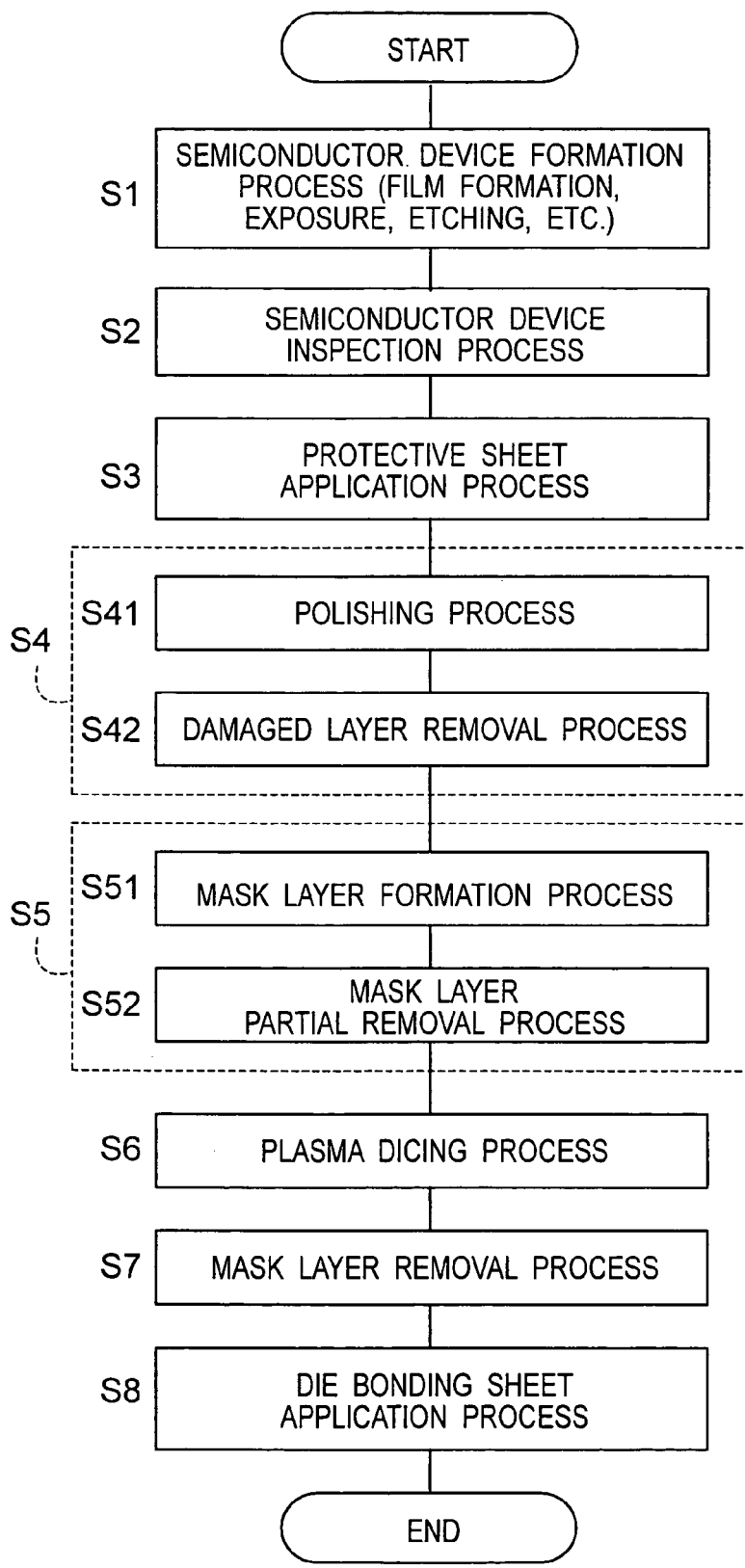
FIG. 3 is a flowchart showing the procedures of the semiconductor device manufacturing process in the first embodiment.
Figure 4A:
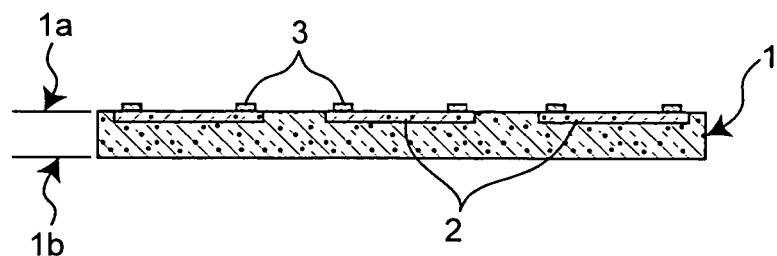
FIG. 4A is a schematic explanatory view for explaining each process in the flowchart in FIG. 3, in which a semiconductor wafer has semiconductor devices formed thereon.

First, in step S1 in the flowchart of FIG. 3, the processing such as film formation, exposure and etching is applied to a circuit-formation-face 1a that is a first surface of the semiconductor wafer 1 to form a plurality of circuit formation portions 2 which become semiconductor devices as shown in FIG. 4A (semiconductor device formation process). Further, in each of the circuit formation portions 2, a plurality of external connection electrodes 3 are formed from conductive materials in the state of being exposed from the circuit-formation-face 1a.

Next, in order to determine whether or not the semiconductor wafer 1 having respective circuit formation portions 2 and the external connection electrodes 3 formed thereon has any defect portions in its formation state, the formation states of the respective circuit formation portions 2 and the external connection electrodes 3 are inspected (semiconductor device inspection process, step S2). In this inspection, it is mainly inspected whether or not the circuit formation portions 2 and the external connection electrodes 3 have any defects in their electric characteristics. Based on the result of the inspection, the quality check is performed by every circuit formation portion 2, and with respect to those circuit formation portions 2 determined to be flawed, their position information for the semiconductor wafer 1 is formed and stored. Such position information may be stored in a storage device included in the inspection apparatus for performing the inspection or may be stored in a storage device included in a management system for managing the entire manufacturing process of semiconductor devices and the like. The type of the storage configuration may take various forms as long as the position information is stored in the state accessible in the following processes. Further, the position information is created and maintained not only in the case of the position information for those circuit formation portions 2 determined to be flawed, but in the case of the position information for the circuit formation portions 2 determined, on the contrary, to be acceptable, so that the acceptable circuit formation portions 2 may be distinguished from the flawed circuit formation portions 2.

Figure 4B:
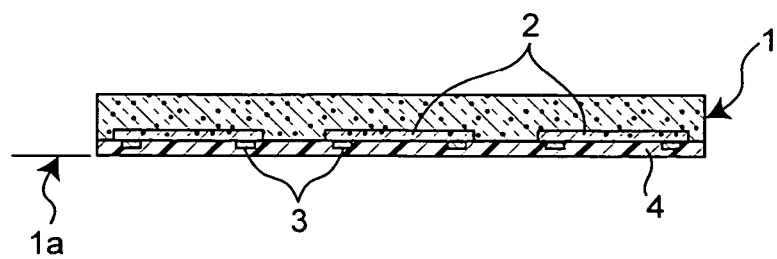
FIG. 4B is a schematic explanatory view for explaining each process in the flowchart in FIG. 3, in which the semiconductor wafer has a protective sheet being applied in a protective sheet application process.

Next, as shown in FIG. 4B, a protective sheet 4 is applied to the circuit-formation-face 1a through an adhesive agent so as to prevent the circuit-formation-face 1a of the semiconductor wafer 1 after completion of the inspection process from being damaged during subsequent processing (protective sheet application process, step S3). It is to be noted that the protective sheet 4 is formed into almost the same shape as the external shape of the semiconductor wafer 1 so as to cover the entire circuit-formation-face 1a and not to protrude outward from the end portion of the semiconductor wafer 1. By using the protective sheet 4 in such a shape, it becomes possible to prevent damage during the following processes such as plasma processing.

Figure 4C:
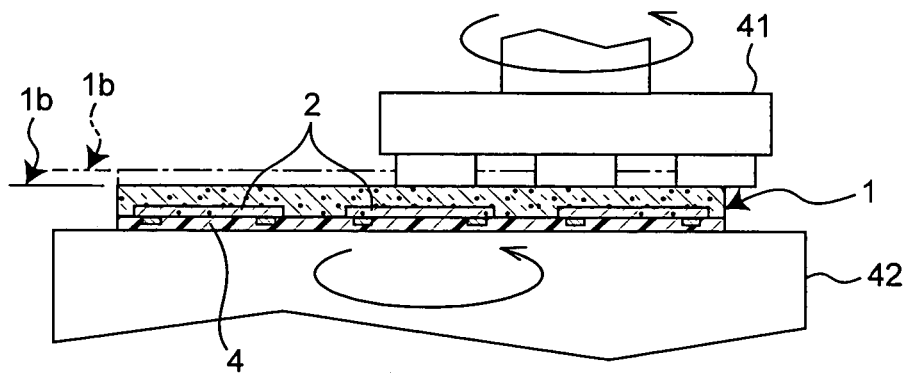
FIG. 4C is a schematic explanatory view for explaining each process in the flowchart in FIG. 3, in which the semiconductor wafer is subjected to a polishing process.

Next, in step S41 in FIG. 3, a polishing process for thinning the thickness of the semiconductor wafer 1 is performed. More specifically, as shown in FIG. 4C, with the circuit-formation-face 1a of the semiconductor wafer 1 being on the lower side as viewed in the drawing, the semiconductor wafer 1 is placed on a holding table 42 through the protective sheet 4 and the placing position is held. In this state, a processing-target-face 1b (second surface or mask placement-side surface on which a mask is placed in the following processes) that is a surface on the opposite side of the circuit-formation-face 1a of the semiconductor wafer 1 is polished by using a grinding wheel 41. On the lower face of the grinding wheel 41 as viewed in the drawing, a grinding stone is fixed, and the grinding stone is rotated along the processing-target-face 1b of the semiconductor wafer 1 in the state of being in contact with the surface to perform polishing of the processing-target-face 1b. By such polishing treatment, the semiconductor wafer 1 is thinned to have a thickness of about 100 μm or smaller, e.g., 50 μm in the first embodiment.

Figure 4D:
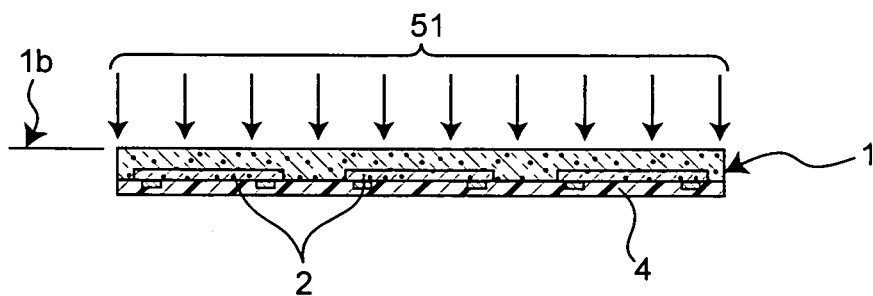
FIG. 4D is a schematic explanatory view for explaining each process in the flowchart in FIG. 3, in which the semiconductor wafer is subjected to a damaged layer removal process.

In the vicinity of the surface of the processing-target-face 1b of the semiconductor wafer 1 subjected to the polishing process, a damaged layer retaining stress imparted by polishing with the grinding wheel 41 is formed. Such a damaged layer being left on the formed semiconductor devices degrades the resistance of the semiconductor devices, and causes deterioration of their quality. In order to prevent such deterioration of the quality, the damaged layer formed on the processing-target-face 1b of the semiconductor wafer 1 is removed as shown in FIG. 4D (damaged layer removal process, step S42). For example, as shown in FIG. 4D, an etching solution (sulfuric acid, nitric acid, phosphoric acid, fluorinated acid, etc.) 51 is brought into contact with the damaged layer formed on the processing-target-face 1b of the semiconductor wafer 1 so as to remove the damaged layer by corroding the damaged layer by the chemical reaction (wet etching treatment). It is to be noted that instead of using the wet etching treatment as the removal processing of the damaged layer, the damaged layer may be removed by applying plasma etching to the processing-target-face 1b (plasma etching process), or the damaged layer may be removed by performing polishing on the processing-target-face 1b. Moreover, the process combining the polishing process in step S41 and the damaged layer removal process in step S42 constitutes the thinning process in step S4.

After such a thinning process is applied, as shown in FIG. 5, a mask layer 5 is formed on the processing-target-face 1b of the semiconductor wafer 1 (mask layer formation process, step S51). The mask layer 5 is for forming mask patterns for use in the later-described plasma dicing process, the mask pattern being formed from a material, such as aluminum and resin, having tolerance against plasma produced with use of fluorinated gasses.

In the case of using aluminum, a method for forming an aluminum thin film on the processing-target-face 1b by deposition and a method for applying a foil-like aluminum thin film are used. In the case of using resin, a method for applying a resin formed in a film shape and a method for coating the processing-target-face 1b with a liquid resin by spin coat method and the like may be used.

Figure 5A:
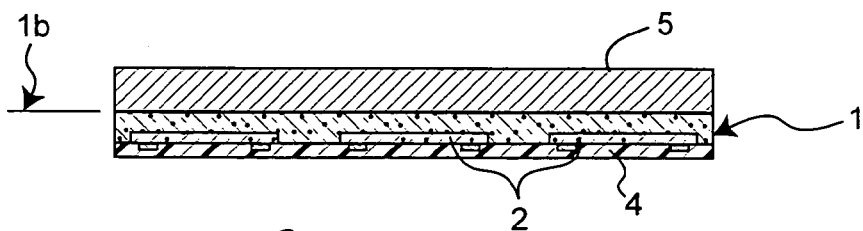
FIG. 5A is a schematic explanatory view for explaining each process in the flowchart in FIG. 3, in which the semiconductor wafer has a mask layer formed in a mask layer formation process.
Figure 5B:
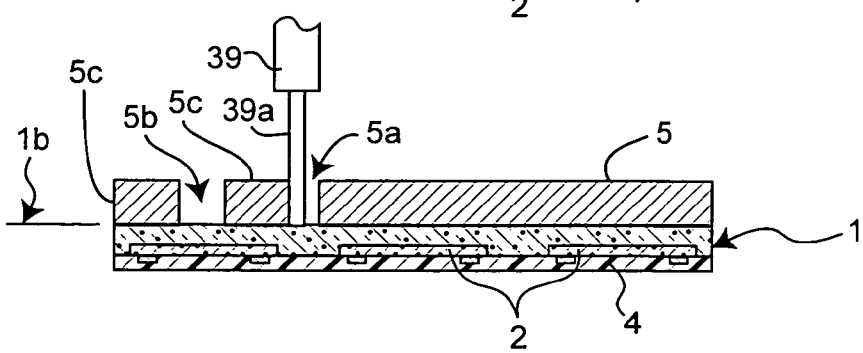
FIG. 5B is a schematic explanatory view for explaining each process in the flowchart in FIG. 3, in which the semiconductor wafer has a dicing line mask removal portion and a bad mark mask removal portion formed in a mask layer partial removal process.

Next, as shown in FIG. 5B, partial removal of the mask layer 5 by laser processing is performed (mask layer partial removal process, step S52). More specifically, in the laser processing apparatus 102 shown in FIG. 2, the semiconductor wafer 1 having the mask layer 5 formed on the processing-target-face 1b is placed on the wafer holding unit 40 through the protective sheet 4 which is applied to the circuit-formation-face 1a, and the placing position is held. After that, while the camera 38 is moved by the moving apparatus 35 along the surface of the semiconductor wafer 1, an image of the circuit patterns of the semiconductor wafer 1 is obtained. By performing recognition processing of the obtained image in the recognition section 34, the actual position of the semiconductor wafer 1 is recognized. The control section 33 controls the moving apparatus 35 based on the result of the recognition processing and the position data on the dicing positions (positions of the dicing lines) stored in the work data storage section 32, and moves the laser irradiation unit 39 along the dicing positions of the semiconductor wafer 1. While moving the laser irradiation unit 39, the control section 33 controls the laser generation unit 36 based on the data on the width of the dicing lines, and irradiates a laser beam with an output appropriate for removing the mask layer 5 with a removal width corresponding to the width. With such irradiation of the laser beam 39a, a dicing mask removal portion 5a where the mask layer 5 is partially removed is formed at the dicing positions of the respective semiconductor devices as shown in FIG. 5B.

In the work data storage section 32 of the laser processing apparatus 102, the position information of the flawed circuit formation portions 2 created based on the inspection result of the previously performed semiconductor device inspection process (step S2), i.e., the position information for the flawed semiconductor devices, are inputted through the operation/input section 31. Such input of the position information may be conducted through wireless communication means, wire communication means or storage media. During removal processing of the mask layer 5 along the dicing positions, the control section 33 controls the moving apparatus 35, the laser generation unit 36 and the laser irradiation unit 39 based on the position information for the flawed semiconductor devices held in the work data storage section 32 so as to irradiate the laser beam 39a to the mask layer 5 placed on the processing-target-face 1b of the flawed semiconductor devices, by which the mask layer 5 is partially removed so as to expose a part of the processing-target-face 1b of the flawed semiconductor devices.

More specifically, in the semiconductor wafer 1 shown in FIG. 5B, if a semiconductor device positioned on the left end as viewed in the drawing is a flawed semiconductor device, the mask layer 5 is partially removed so as to expose an almost central area of the processing-target-face 1b of the flawed semiconductor device in an almost circular shape. A portion of the mask layer 5, which has been partially removed as described above, is a bad mark mask removal portion 5b on which a bad mark (flawed semiconductor device distinguishing mark) is formed in the following plasma dicing process. In the case where a plurality of flawed semiconductor devices is present on the semiconductor wafer 1, the partial removal of the mask layer 5 is executed so as to partially expose the surfaces of all of the flawed semiconductor devices.

As for the semiconductor devices, which have been determined not to be flawed but to be acceptable, the partial removal of the mask layer 5 is not executed. Portions of the mask layer 5 remaining after portions corresponding to the dicing mask removal portion 5a and the bad mark mask removal portion 5b are removed make masks 5C, and portions (surfaces) of the masks 5C are portions to which etching is not applied during the later-executed plasma dicing.

Moreover, in the semiconductor device inspection process, the inspection of the semiconductor devices (circuit formation portions 2) is performed from the side of the circuit-formation-face 1a, whereas in the laser processing apparatus 102, the mask layer 5 disposed on the side of the processing-target-face 1b of the semiconductor wafer 1 is processed. Therefore, the position information for the flawed semiconductor devices created and obtained during the inspection process is handled as information in which the upper and lower faces of the semiconductor wafer 1 are inverted in the laser processing. Moreover, the position information of such flawed semiconductor devices and dicing line data may be combined to constitute mask data for formation of mask patterns.

Figure 6:
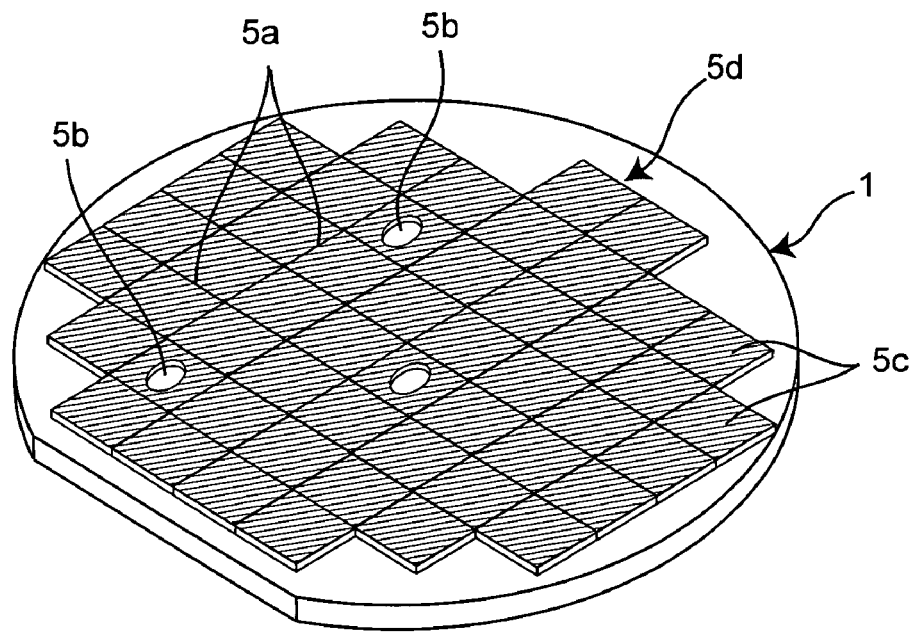
FIG. 6 is a schematic perspective view showing the semiconductor wafer having a mask pattern formed thereon.

Thus, by executing a mask pattern formation process (S5) composed of the combination of the mask layer formation process in step S51 and the mask layer partial removal process in step S52, for example, mask patterns 5b as shown in the schematic perspective view of the semiconductor wafer 1 in FIG. 6 are formed. Such mask patterns 5b comprise the dicing line mask removal portions 5a, the bad mark mask removal portions 5b and the masks 5c, and in the case of the semiconductor wafer 1 shown in FIG. 6, three flawed semiconductor devices are present. Although description is given of the case where in the outer peripheral portion of the semiconductor wafer 1, the mask layer 5 on a portion without the semiconductor devices is also removed in FIG. 6, the present embodiment is not limited to this case and therefore is applicable to the case where, for example, the mask layer 5 on this portion is not removed.

Next, by performing plasma etching on the semiconductor wafer 1 with the mask patterns 5d being formed thereon, dicing of the semiconductor wafer 1 into respective separate semiconductor devices (plasma dicing process, step S6) is performed.

More specifically, in the plasma processing apparatus 101 shown in FIG. 1, the semiconductor wafer 1 is placed on the placing face 13a of the lower electrode 13 through the protective sheet 4 with the processing-target-face 1b having the mask patterns 5d formed thereon being the upper face. Then, the vacuum chamber 11 is enclosed and the air discharging pump 19 is driven to vacuumize the processing chamber 12 (e.g., to approx 100 Pa), while a gas is supplied at a flow rate regulated by the flow regulating valve 16 from the plasma generation gas supply unit 17 to the inside of the processing chamber 12 through the gas supply hole 14a and the porous plate 15. In such a state, a high-frequency voltage is applied to the lower electrode 13 from the RF power supply unit 20 so that plasma is generated in the electric discharge space between the upper electrode 14 and the lower electrode 13.

Figure 5C:
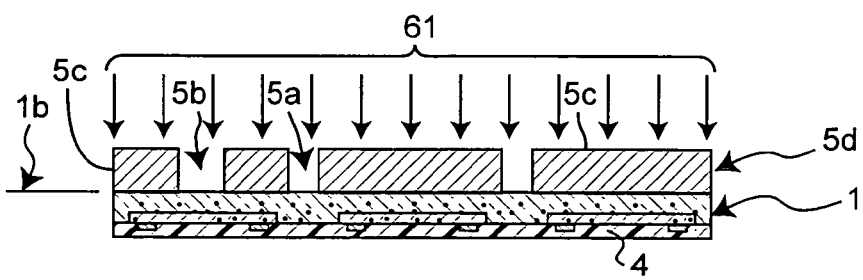
FIG. 5C is a schematic explanatory view for explaining each process in the flowchart in FIG. 3, in which the semiconductor wafer is subjected to etching in a plasma dicing process.

As shown in FIG. 5C, a plasma 61 generated in the electric discharge space is irradiated to the mask patterns 5d formed on the processing-target-face 1b of the semiconductor wafer 1 in the state of being placed on the placing face 13a of the lower electrode 13. With such irradiation of the plasma 61, the surfaces of the processing-target-face 1b corresponding to the dicing mask removal portions 5a and the bad mark mask removal portions 5b, which are the exposed surfaces without the mask 5C formed thereon, are irradiated with the plasma 61. By such irradiation of the plasma, the exposed surfaces of the processing-target-face 1b are subjected to etching.

Figure 5D:
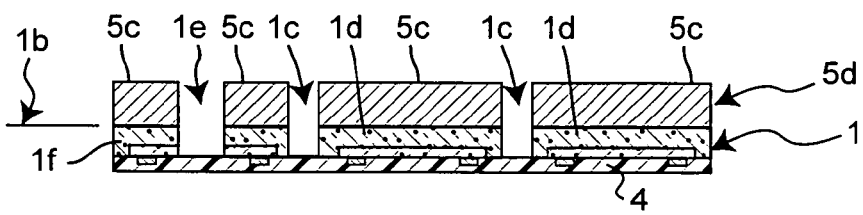
FIG. 5D is a schematic explanatory view for explaining each process in the flowchart in FIG. 3, in which the semiconductor wafer is diced into respective separate semiconductor devices.

By application of plasma etching to the exposed surfaces of the processing-target-face 1b of the semiconductor wafer 1, the thickness of portions of the semiconductor wafer 1 corresponding to the exposed surfaces are thinned, and the portions are removed at the end. With this, as shown in FIG. 5D, the semiconductor wafer 1 is diced into respective separate semiconductor devices 1d along dicing lines 1c, and almost circular-shaped through hole are formed as bad marks 1e in a central area of flawed semiconductor devices 1f along the bad mark mask removal portions 5b.

Figure 5E:
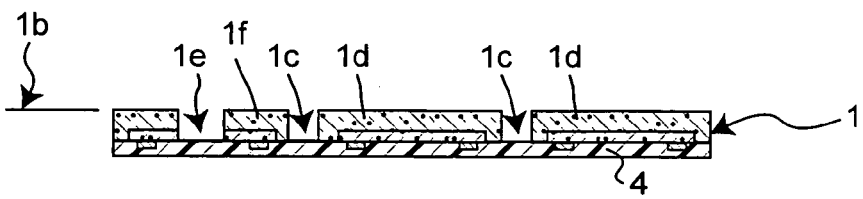
FIG. 5E is a schematic explanatory view for explaining each process in the flowchart in FIG. 3, in which the semiconductor wafer has the mask removed in a mask layer removal process.
Figure 7:
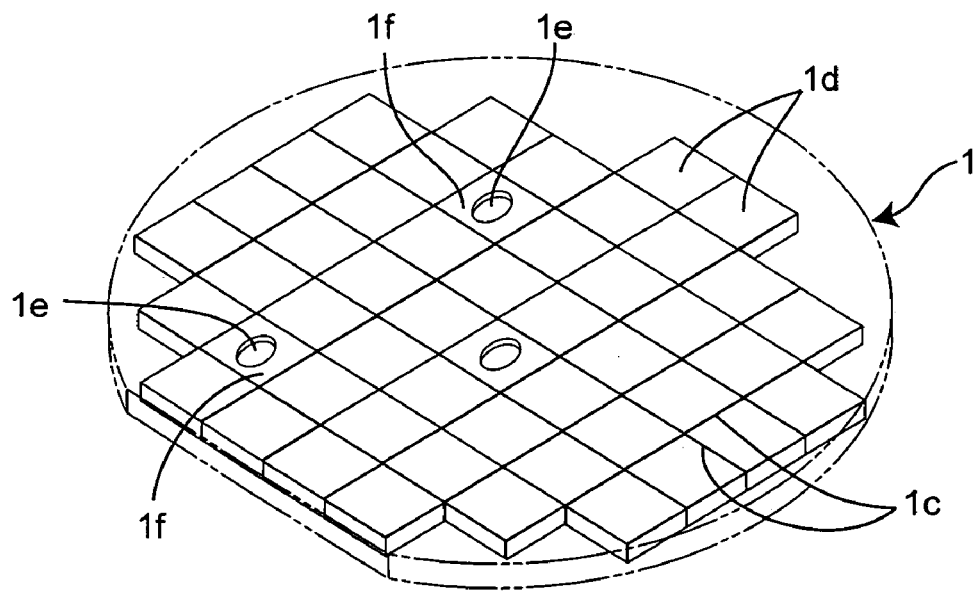
FIG. 7 is a schematic perspective view showing the semiconductor wafer having the mask removed after the plasma dicing.

After that, as shown in FIG. 5E, the masks 5c remaining on the processing-target-faces 1b of the diced semiconductor devices 1d and the flawed semiconductor devices 1f are removed by applying, for example, ashing (mask layer removal process, step S7). FIG. 7 shows a schematic perspective view of the semiconductor wafer 1 subjected to the mask layer removal process. As shown in FIG. 7, the respective semiconductor devices 1d and the flawed semiconductor devices 1f are separated into respective pieces, and in the central area of the each of the flawed semiconductor devices 1f, the bad mark 1e is formed as an almost circular-shaped through hole.

Figure 5F:
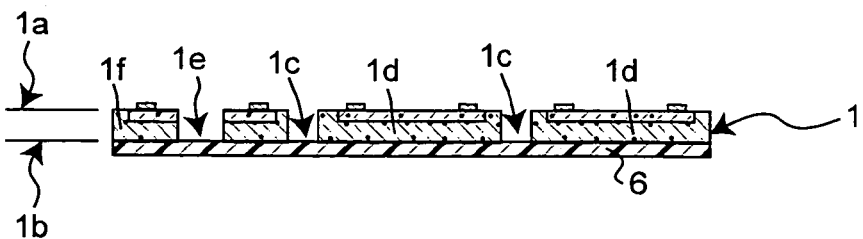
FIG. 5F is a schematic explanatory view for explaining each process in the flowchart in FIG. 3, in which the semiconductor wafer has a die bonding sheet applied thereto.

After that, as shown in FIG. 5F, an adhesive sheet (die bonding sheet) 6 is applied to the processing-target-face 1b of the semiconductor wafer 1 (die bonding sheet application process, step S8), and the protective sheet 4 protecting the circuit-formation-face 1a of the semiconductor wafer 1 is removed. The adhesive sheet 6 herein has a size larger than the semiconductor wafer 1 and is fixed to its surrounding by an unshown wafer-ring (jig). Holding the wafer-ring allows handling of the semiconductor wafer 1. With this, the manufacturing process of semiconductor devices is completed.

Thus, each circuit-formation-face 1a of the semiconductor devices 1d in the state of adhering to the adhesive sheet 6 is sucked and held by, for example, a suction nozzle, and in this state, the suction nozzle is raised so that the sucked and held semiconductor devices 1d can be removed from the adhesive sheet 6 and be picked up. During such suction and picking-up by the suction nozzle, an image of the circuit-formation-face 1a of the semiconductor devices 1d is obtained by an image pickup apparatus and the image is subjected to recognition processing, by which those semiconductor devices id to be picked up are identified. As shown in FIG. 5F, since the flawed semiconductor device 1f has the circular-shaped through hole formed as the bad mark 1e, light reflectance on its circuit-formation-face 1a is largely different from the circuit-formation-face 1a of the other semiconductor devices 1d, which makes it possible to clearly distinguish the flawed semiconductor device 1f from the other semiconductor devices 1d during the above-stated recognition processing. Therefore, it becomes possible to securely prevent the flawed semiconductor device 1f from being picked up by mistake during picking-up of the semiconductor devices 1d.

Moreover, suction and holding of the semiconductor devices 1d by the suction nozzle is implemented by sucking and holding the almost central area of the circuit-formation-face 1a, and since the flawed semiconductor device 1f has the almost circular-shaped through hole formed as the bad mark 1e, suction and holding of the circuit-formation-face 1a of the flawed semiconductor device can also be structurally prevented.

Moreover, the bad mark 1e formed on such flawed semiconductor devices 1f allows an operator to clearly recognize by sight, thereby making it possible to clearly distinguish the flawed semiconductor device 1f from the other semiconductor devices 1d.

The size of the bad mark 1e formed on such flawed semiconductor devices 1f (i.e., the size of the bad mark mask removal portion 5b) is determined depending on the size (planar size) of semiconductor devices (or flawed semiconductor devices), and is preferably determined, for example, in the size range of about 10% to 40% of the size of the semiconductor device. Particularly, the size of the bad mark 1e is preferably not less than the size which enables the visible recognition apparatus to surely recognize whether or not the bad mark 1e is formed on a certain semiconductor device 1d, when the semiconductor device 1d is sucked and held from the semiconductor wafer 1 which was diced and is covered with the adhesive sheet 6 in a die bonding apparatus or the like.

It is to be understood that the bad mark 1e is not limited to those formed as the through holes as described above. For example, instead of the case where a portion of the semiconductor wafer 1 corresponding to the exposed surface in the bad mark mask removal portion 5b is completely removed, the bad mark may be formed by removing a part thereof, e.g., about a half depth thereof. However, in the case where "partial removal" is conducted, the formed bad mark needs to have a recognizable size. Therefore, in the present specification, "removal" of the exposed portion in the bad mark mask removal portion herein signifies not only the case of "complete" removal but also the case of "partial" removal.

Moreover, the formation of the bad marks 1e for clearly distinguishing such flawed semiconductor devices 1f from the other semiconductor devices 1d is achieved by performing plasma dicing with the use of the bad mark mask removal portions 5b formed together with the dicing mask removal portions 5a which define the dicing lines in the mask pattern formation process. Therefore, an additional new process for formation of such bad marks 1e is not necessary, and therefore forming of the bad marks 1e is made more efficient.

Moreover, the bad mark 1e is not formed as the prominent portion with use of inks and resist layers like conventional bad marks but formed as the almost-circular-shaped through hole, and further, since the formation of the bad mark 1e is performed after the thinning processing of the semiconductor wafer 1 is executed, recess portions and the like formed on the surface of the semiconductor wafer 1 due to the thinning processing can be surely prevented, thereby allowing manufacturing of high-quality semiconductor devices. It is to be noted that since the size and the prominence height of the respective external connection electrodes 3 formed on the circuit-formation-face 1a of the respective semiconductor devices are sufficiently smaller (e.g., about ⅕ to ¹⁄₁₀ times) than the size and the prominence height of the prominent portion of the conventional bad mark formed with use of inks and the resist layers, the extrusions or indentions of the circuit-formation-face 1a caused by formation of these external connection electrodes 3 can be sufficiently absorbed by the protective sheet 4 applied to the circuit-formation-face 1a, and will not exert an influence during the thinning processing.

Moreover, by forming the bad mark mask removal portion 5b as the almost circular-shaped through hole in the center area of the processing-target-face 1b of the flawed semiconductor device 1f, the dicing mask removal portions 5a can be formed between the flawed semiconductor device 1f and the adjacent semiconductor devices 1d. Thus, by applying plasma etching in the state that the dicing mask removal portion 5a is formed in between all the adjacent semiconductor devices on the semiconductor wafer 1 regardless of the shape of the dicing mask removal portion 5a, the etching state can be maintained almost uniform. Therefore, plasma dicing can be conducted under the uniform conditions despite whether adjacent semiconductor devices are the flawed semiconductor devices or not, which makes it possible to manufacture high-quality semiconductor devices.

It is to be noted that the present invention is not limited to this embodiment and is applicable to other various aspects. For example, FIGS. 8A, 8B, 8C, 8D, 8E, and 8F show the schematic explanatory views for showing part of the procedures in the manufacturing method for semiconductor devices according to a second embodiment of the present invention. The manufacturing method for semiconductor devices in the second embodiment, which is performed in the procedures similar to those in the flowchart in FIG. 3 showing the procedures in the manufacturing method in the first embodiment, is different from the first embodiment in the point that the formation of the bad mark is not involved and the flawed semiconductor device itself is removed by etching during plasma etching. Hereinbelow, description is given on the different point.

Figure 8A:
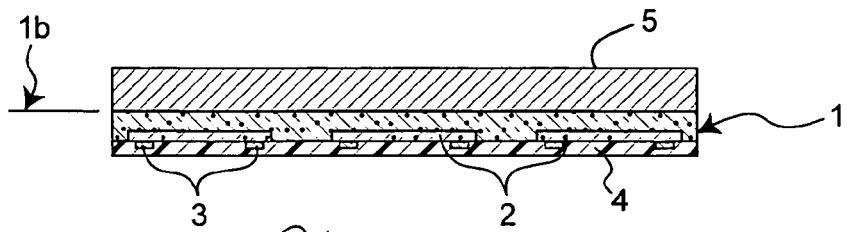
FIG. 8A is a schematic explanatory view for explaining part of the manufacturing process of semiconductor devices according to a second embodiment of the present invention, in which the semiconductor wafer has a mask layer formed in the mask layer formation process.
Figure 8B:
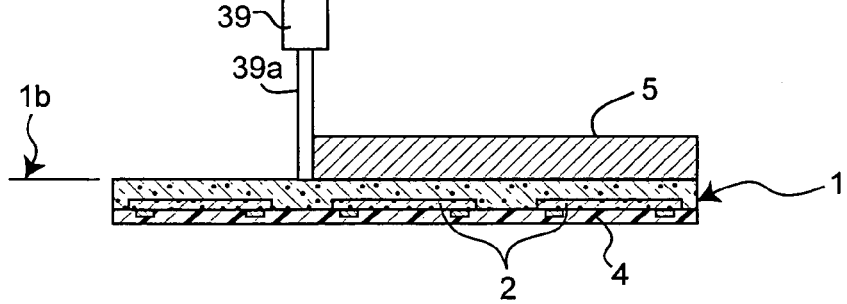
FIG. 8B is a schematic explanatory view for explaining part of the manufacturing process of semiconductor devices according to the second embodiment of the present invention, in which the semiconductor wafer has the mask layer partially removed in the mask layer partial removal process.
Figure 9:
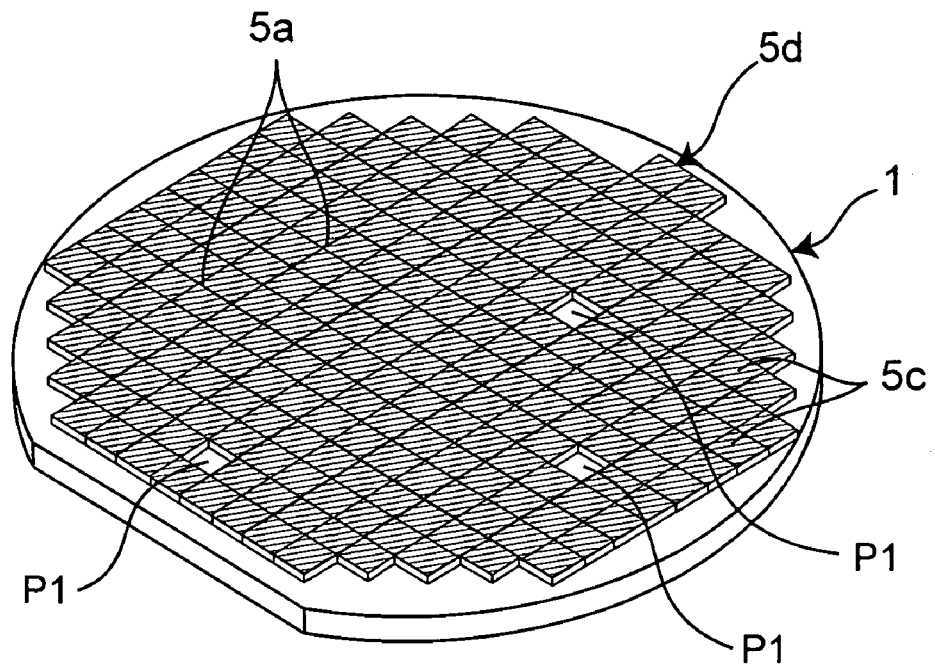
FIG. 9 is a schematic perspective view for showing the semiconductor wafer having mask patterns formed thereon in the second embodiment.

First, as shown in FIG. 8A, a mask layer 5 is formed on a processing-target-face 1b of the semiconductor wafer 1 after thinning processing is applied and removal the damaged layer is performed. After that, in the laser processing apparatus 102, the formed mask layer 5 is processed with the laser beam 39a to form the dicing mask removal portion 5a along dicing positions (positions of the dicing lines). In this case, based on position information of the flawed semiconductor devices, processing with the laser beam 39a is performed so as to totally remove the mask layer 5 placed on the processing-target-face 1b of the flawed semiconductor devices. More specifically, as shown in FIG. 8B, if it is determined that a circuit formation portion 2 disposed on the left end as viewed in the drawing is flawed based on the position information of the flawed semiconductor devices, the mask layer 5 disposed on the entire processing-target-face 1b of the flawed semiconductor device is removed by irradiation of the laser beam 39a, and the entire surface thereof is put in the state of being exposed. Herein, FIG. 9 shows a schematic perspective view of the semiconductor wafer 1 with the mask patterns 5d formed thereon by such partial removal of the mask layer 5. In FIG. 9, portions denoted by reference numeral P1 correspond to the flawed semiconductor devices with the mask layer 5 removed, and on this semiconductor wafer 1, three flawed semiconductor devices are present.

Figure 8C:
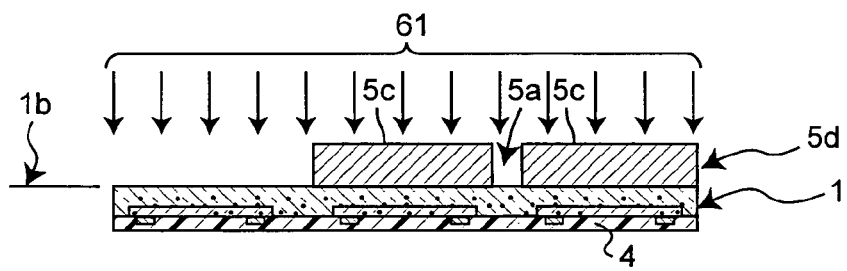
FIG. 8C is a schematic explanatory view for explaining part of the manufacturing process of semiconductor devices according to the second embodiment of the present invention, in which the semiconductor wafer is subjected to etching in the plasma dicing process.
Figure 8D:
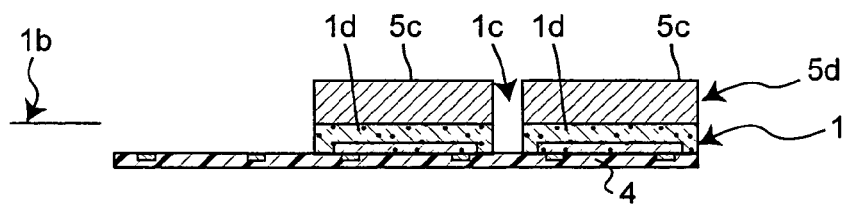
FIG. 8D is a schematic explanatory view for explaining part of the manufacturing process of semiconductor devices according to the second embodiment of the present invention, in which the semiconductor wafer is diced into respective separate semiconductor devices.
Figure 8E:
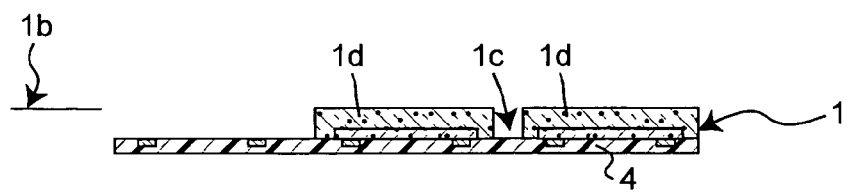
FIG. 8E is a schematic explanatory view for explaining part of the manufacturing process of semiconductor devices according to the second embodiment of the present invention, in which a semiconductor wafer has the mask removed in the mask layer removal process.

Then, as shown in FIG. 8C, plasma etching is applied to the semiconductor wafer 1 having the mask pattern 5d formed thereon in the plasma processing apparatus 101. With this, the processing-target-face 1b with the dicing mask removal portion 5a formed thereon and the processing-target-face 1b of the flawed semiconductor devices are irradiated with the plasma 61 and are subjected to etching. As a result, as shown in FIG. 8D, the semiconductor wafer 1 is diced into respective separate semiconductor devices 1d and the flawed semiconductor devices themselves are removed and eliminated.

Figure 8F:
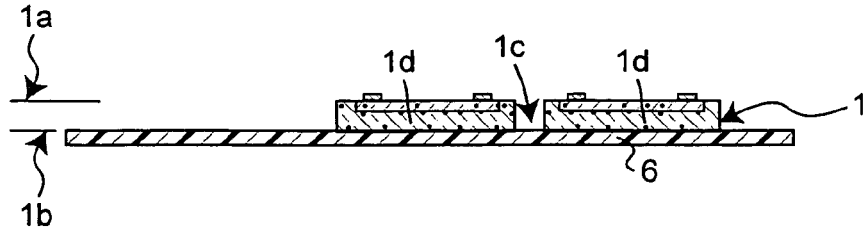
FIG. 8F is a schematic explanatory view for explaining part of the manufacturing process of semiconductor devices according to the second embodiment of the present invention, in which the semiconductor wafer has a die bonding sheet applied thereto.

After that, the mask removal process is performed as shown in FIG. 8F, and further, the die bonding sheet application process is performed as shown in FIG. 8, by which the manufacturing process of semiconductor devices is completed.

Figure 10:
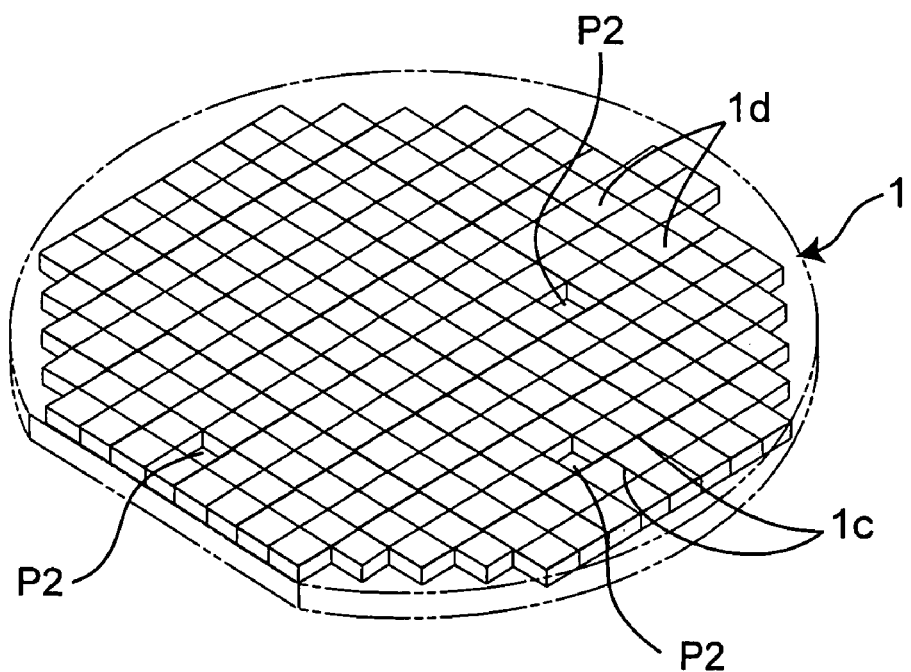
FIG. 10 is a schematic perspective view for showing the semiconductor wafer having the mask removed after the plasma dicing in the second embodiment.

FIG. 10 shows a schematic perspective view of the semiconductor wafer 1 on which the flawed semiconductor devices are removed and which is diced into respective separate semiconductor devices 1d as viewed from the side of the processing-target-face 1b. FIG. 10 indicates that semiconductor devices 1d are removed (eliminated) at three locations as denoted by reference numeral P2 on the semiconductor wafer 1.

On such a semiconductor wafer 1, the flawed semiconductor devices are completely removed and eliminated, and therefore as shown in FIG. 8F, the respective semiconductor devices 1d in the final manufacturing stage do not include the flawed semiconductor devices themselves. Therefore, during picking-up of the semiconductor devices 1d performed thereafter, picking-up of the flawed semiconductor devices by mistake can be prevented completely.

Although in each of the embodiments, description has been made of the case where the mask layer 5 formed on the semiconductor wafer 1 is processed with a laser beam based on the position information of the flawed semiconductor devices created and obtained in the semiconductor device inspection process, the present invention is not limited to this case.

Instead of this case, the mask constituting the mask patterns created in advance based on the position information of the flawed semiconductor devices may be placed on the processing-target-face 1b of the semiconductor wafer 1 so as to partially or completely expose the surface of the flawed semiconductor devices.

Moreover, in the case where the inspection process in the manufacturing process of semiconductor devices is performed separately from the processes following the mask formation process, the mask data created in combination of the position information of the flawed semiconductor devices and dicing line information may be inputted into the laser processing apparatus 102 for processing the mask layer 5 based on the mask data.

More particularly, when the mask patterns, which are for use in plasma dicing, are placed so as to (partially or completely) expose the surface of the flawed semiconductor devices, the bad marks may be formed on the flawed semiconductor devices, or the flawed semiconductor devices themselves may be eliminated, and the method therefore may take various forms.

Moreover, the bad mark mask removal portion 5b is not limited to those formed as almost circular-shaped through holes as shown in the first embodiment, but may include those formed as, for example, polygon-shaped or oval-shaped through holes. Further, a plurality of the bad mark mask removal portions 5b may be formed for one flawed semiconductor device 1f. Further, in the case where a flawed semiconductor device 1f is disposed on the outermost portion of the semiconductor wafer 1 in FIG. 6, instead of forming the bad mark mask removal portion in an almost central area of the flawed semiconductor device 1f, the bad mark mask removal portion may be formed so as to exclude the peripheral end side where the semiconductor devices 1d are not disposed adjacently. In such a case, the bad mark mask removal portion 5b may still be formed between the adjacent semiconductor devices 1d to maintain the uniformity of etching.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-225104 filed on Aug. 2, 2004 including specification, drawing and claims are incorporated herein by reference in its entirety.

What is claimed is:

1. A manufacturing method for semiconductor devices comprising:
    placing a mask on a mask placement-side surface of a semiconductor wafer in which a plurality of semiconductor devices are formed;
    a mask pattern formation process including forming dicing lines for dicing the semiconductor wafer into the respective separate semiconductor devices and at least partially exposing the mask placement-side surface of the semiconductor wafer corresponding to a flawed semiconductor device among the plurality of semiconductor devices;
    a dicing process including dicing the semiconductor wafer, along the dicing lines, to separate the respective semiconductor devices, and
    removing at least a portion of the flawed semiconductor device at the exposed portion of the semiconductor wafer so that the removed portion serves as a distinguishing mark for the flawed semiconductor device, wherein the portion of the flawed semiconductor device is removed by applying plasma etching to the mask placement-side surface of the semiconductor wafer.

2. The manufacturing method for semiconductor devices as defined in claim 1, wherein the mask is formed so as to partially expose the surface of the semiconductor wafer corresponding to the flawed semiconductor device on basis of position information for the flawed semiconductor device in the semiconductor wafer.

3. The manufacturing method for semiconductor devices as defined in claim 2, wherein the position information for the flawed semiconductor device is obtained by using a result of an inspection performed on the respective semiconductor devices in the semiconductor wafer.

4. The manufacturing method for semiconductor devices as defined in claim 3, wherein
    after the inspection of the respective semiconductor devices, thinning of the semiconductor wafer is performed, and then
    the mask is placed on the thinned semiconductor wafer.

5. The manufacturing method for semiconductor devices as defined in claim 1, further comprising:
    obtaining position information for the flawed semiconductor device in the semiconductor wafer before placing the mask, wherein
    the mask is formed on the basis of the obtained position information for the flawed semiconductor device.

6. The manufacturing method for semiconductor devices as defined in claim 1, wherein in the mask pattern formation process,
    the mask is placed so as to cover the entire mask placement-side surface of the semiconductor wafer, and then
    parts of the mask are removed in conformity with the respective positions of the dicing lines on the semiconductor wafer so as to partially expose the surface of the semiconductor wafer to define the dicing lines, and a part of the mask on the flawed semiconductor device is removed so as to partially expose the surface semiconductor wafer at the flawed semiconductor device.

7. The manufacturing method for semiconductor devices as defined in claim 6, wherein the parts of the mask are removed by irradiating a laser beam to the mask of the semiconductor wafer while moving the laser beam relative to the surface of the semiconductor wafer.

8. The manufacturing method for semiconductor devices as defined in claim 7, wherein the relative movement of the laser beam is based on preset mask data.

9. The manufacturing method for semiconductor devices as defined in claim 7, wherein relative movement of the laser beam is based on position information for the dicing lines and position information for the flawed semiconductor device in the semiconductor wafer.

10. The manufacturing method for semiconductor devices as defined in claim 1, wherein, during the mask pattern formation process, an almost central area of the semiconductor wafer at the flawed semiconductor device is exposed in an almost circular shape.

11. The manufacturing method for semiconductor devices as defined in claim 1, further comprising:

removing the remaining portions of the mask from the mask placement-side surface of the semiconductor wafer, after dicing the semiconductor wafer and removing the exposed portion thereof.

* * * * *